(12) United States Patent
Kiribuchi

(10) Patent No.: US 12,395,092 B2
(45) Date of Patent: Aug. 19, 2025

(54) CONNECTOR DEVICE AND LOAD DEVICE

(71) Applicant: OMRON Corporation, Kyoto (JP)

(72) Inventor: Takeshi Kiribuchi, Kyoto (JP)

(73) Assignee: OMRON CORPORATION, Kyoto (JP)

( * ) Notice: Subject to any disclaimer, the term of this patent is extended or adjusted under 35 U.S.C. 154(b) by 199 days.

(21) Appl. No.: 18/254,516

(22) PCT Filed: Mar. 9, 2021

(86) PCT No.: PCT/JP2021/009187
§ 371 (c)(1),
(2) Date: May 25, 2023

(87) PCT Pub. No.: WO2022/137578
PCT Pub. Date: Jun. 30, 2022

(65) Prior Publication Data
US 2024/0014747 A1    Jan. 11, 2024

(30) Foreign Application Priority Data

Dec. 23, 2020 (JP) ................................ 2020-213836

(51) Int. Cl.
*H02M 7/00* (2006.01)
*H02M 1/00* (2007.01)
*H05K 5/02* (2006.01)

(52) U.S. Cl.
CPC ........... *H02M 7/003* (2013.01); *H02M 1/008* (2021.05); *H05K 5/0247* (2013.01)

(58) Field of Classification Search
CPC . B60R 16/03; H02P 27/06; H02P 5/74; H02P 5/68; H02M 1/008; H02M 7/003; H05K 5/0247
See application file for complete search history.

(56) References Cited

U.S. PATENT DOCUMENTS

2011/0118874 A1    5/2011   Tanabe et al.
2013/0119901 A1*   5/2013   Gries ................. H02M 7/003
                                              307/31
(Continued)

FOREIGN PATENT DOCUMENTS

JP    H07178230 A    7/1995
JP    H09247903 A    9/1997
(Continued)

OTHER PUBLICATIONS

International Search Report issued in Intl. Appln. No. PCT/JP2021/009187 mailed May 18, 2021. English translation provided.
(Continued)

*Primary Examiner* — Ryan Johnson
(74) *Attorney, Agent, or Firm* — ROSSI, KIMMS & McDOWELL LLP

(57) ABSTRACT

A connector device connects a load device to a power supply path in a daisy chain to allow transmission and reception of power between the load device and the power supply path. The connector device includes a housing, an upstream connector connectable to an upstream portion of the power supply path, a downstream connector connectable to a downstream portion of the power supply path, and a load connector that supplies, to a body of the load device, power divided from an internal supply path connecting the upstream connector and the downstream connector in the housing. The connector device is separate from the body of the load device. A combination of the load device and a rated current of at least one of the upstream connector or the downstream connector is changeable based on a current flowing through the upstream connector and a current flowing through the downstream connector.

16 Claims, 5 Drawing Sheets

(56) References Cited

U.S. PATENT DOCUMENTS

2017/0291298 A1* 10/2017 Saitou ........................ B25J 9/12
2023/0367732 A1* 11/2023 Sakai .................. G06F 13/4068

FOREIGN PATENT DOCUMENTS

| | | |
|---|---|---|
| JP | 2007180195 A | 7/2007 |
| JP | 2011108044 A | 6/2011 |

OTHER PUBLICATIONS

Written Opinion issued in Intl. Appln. No. PCT/JP2021/009187 mailed May 18, 2021. English translation provided.

* cited by examiner

CONNECTOR DEVICE AND LOAD DEVICE

FIELD

The present invention relates to a connector device that allows transmission and reception of power between a power supply path and a load device, and a load device including the connector device.

BACKGROUND

Known load devices such as motors incorporate inverters for driving the load devices. A load device with such a structure can save wiring, but is to be replaced entirely when its inverter is to be replaced for maintenance, increasing the maintenance cost. In response to this, Patent Literature 1 describes, for example, a technique associated with an inverter including a power unit and a control unit that are combined in a detachable manner to allow an intended part alone to be replaced with less maintenance cost.

CITATION LIST

Patent Literature

Patent Literature 1: Japanese Unexamined Patent Application Publication No. 9-247903

SUMMARY

Technical Problem

In a system that feeds power from a power supply to multiple power converters to drive the corresponding multiple load devices, more load devices to be driven use more wires and thus use more space for the wires. The overall machine including the load devices may not be miniaturized. The workload may also increase for the wiring procedure. To reduce the number of wires used for power supply, the multiple power converters may be connected in a daisy chain to a power supply path for feeding power. When power is supplied to power converters in load devices connected in a daisy chain as described above, a current flowing into each load device is partly supplied to its power converter, with the remaining current flowing into another load device located downstream. This causes a current with a different level to flow through each load device depending on a sequential location connected to the power supply path (hereafter referred to as a sequential connection location) in the daisy chain. More specifically, a larger current flows into a load device nearer the power supply located upstream in the sequential connection location in the daisy chain. The power converter in the first load device nearest the power supply is thus to be connected with a wire having a large diameter for the largest current to flow.

A load device to be connected in a daisy chain is typically manufactured without its sequential connection location being predetermined. To accommodate possible use conditions, the load device includes a power input-output portion (e.g., a connector) with a relatively high rated current for any expected current level. The load device may have higher specifications for its power input-output portion than intended in an actual use condition, and may be connected with a wire having a diameter larger than intended, thus decreasing user convenience.

In response to the above issue, one or more aspects of the present invention are directed to a technique for appropriate wiring for load devices to be connected in a daisy chain for power supply.

Solution to Problem

One or more aspects of the present invention are directed to a connector device for connecting a load device to a power supply path in a daisy chain to allow transmission and reception of power between the load device and the power supply path. A combination of a connector device and a load device may be changed as appropriate to allow an input-output portion to appropriately correspond to a current flowing into the load device connected in a daisy chain.

More specifically, a connector device according to an aspect of the present invention is a connector device for connecting a load device to a power supply path in a daisy chain to allow transmission and reception of power between the load device and the power supply path. The connector device includes a housing, an upstream connector connectable to an upstream portion of the power supply path, a downstream connector connectable to a downstream portion of the power supply path, and a load connector that supplies, to a body of the load device, power divided from an internal supply path connecting the upstream connector and the downstream connector in the housing. The connector device is separate from the body of the load device, and a combination of the load device and a rated current of at least one of the upstream connector or the downstream connector is changeable based on a current flowing through the upstream connector and a current flowing through the downstream connector.

The connector device with this structure functions as an input-output portion for power supplied to the load device connected to the power supply path in a daisy chain. A current flowing into the upstream connector partly flows into the load device through the load connector, with the remaining current flowing, through the downstream connector, into another load device located downstream in the daisy chain. The connector device is separate from the body of the load device to allow the load device to use a combination of an upstream connector and a downstream connector with different rated currents. Connectors with different rated currents are connected with wires having different diameters. Thus, the load device can use connectors with rated currents that appropriately correspond to a current flowing into the load device, and thus can avoid using wires with unintentionally large diameters.

In the above connector device, the upstream connector may have a higher rated current than the downstream connector. In a daisy chain, an upstream connector can have a larger current flowing through it than a downstream connector. The upstream connector and the downstream connector have different rated currents as described above to allow wiring with more appropriate wire diameters. In another aspect, the upstream connector and the downstream connector may have the same rated current.

The above connector device may be attachable to and detachable from the body of the load device. In response to the connector device being attached to the body of the load device, the power supply path may supply power at least partly to the load device through the load connector. With the connector device attachable to and detachable from the body of the load device, the user can easily select a combination of an upstream connector and a downstream connector having rated currents appropriate for the load device.

In the above connector device, the housing may be box-shaped and may have a plurality of surfaces. The upstream connector and the downstream connector may be located on different surfaces of the plurality of surfaces. More specifically, the upstream connector and the downstream connector may be located on two facing surfaces of the plurality of surfaces. The connectors located on the different surfaces of the housing can avoid using wires connected to a single portion of the connector device. This may facilitate the wiring procedure for daisy chain connection. In another aspect, the upstream connector and the downstream connector may be located on the same surface of the housing.

The above connector device may include a plurality of the downstream connectors connected to the upstream connector with the internal supply path. In this structure, a current flowing into one upstream connector partly flows into the load connector, with the remaining current being output to a downstream load device connected in the daisy chain through the plurality of downstream connectors. The plurality of downstream connectors may have the same rated current. In another aspect, the plurality of downstream connectors may have different rated currents. In still another aspect, some of the plurality of downstream connectors may have the same rated current, and the other downstream connectors may have different rated currents.

One or more aspects of the present invention may also be directed to a load device connectable to a power supply path in a daisy chain to receive power through the power supply path. The load device includes a connector device attachable to and detachable from a body of the load device. The connector device connects the load device to the power supply path to allow transmission and reception of power between the load device and the power supply path. In the load device, the connector device includes a housing, an upstream connector connectable to an upstream portion of the power supply path, a downstream connector connectable to a downstream portion of the power supply path, and a load connector that supplies, to the body of the load device, power divided from an internal supply path connecting the upstream connector and the downstream connector in the housing. In response to the connector device being attached to the body of the load device, the power supply path supplies power at least partly to the load device through the load connector. A combination of the body of the load device and the connector device is changeable to change a combination of the load device and a rated current of at least one of the upstream connector or the downstream connector based on a current flowing through the upstream connector and a current flowing through the downstream connector.

The load device with this structure receives power supplied in the daisy chain through the connector device that is attachable and detachable. The connector device allows the load device to use connectors with rated currents appropriately corresponding to a current flowing into the load device, and thus can avoid using wires with unintentionally large diameters. The technical ideas described above for the connector device are also applicable to the load device when no technical contradiction occurs.

In the above load device, the connector device may be attachable to and detachable from the load device in an orientation to change positions of the upstream connector and the downstream connector relative to the body of the load device. The wires located upstream and downstream in the daisy chain may be (or may extend) variously in individual structures. The connector device is readily attachable and detachable in an orientation changeable to align the connectors along the extensions of the wires. This reduces the workload on the user for the wiring procedure. More specifically, the connector device may be attachable to the body of the load device with the upstream connector located adjacent to a load device upstream in a daisy chain and with the downstream connector located adjacent to a load device downstream in the daisy chain.

The above load device may be a motor including the body incorporating a power converter that generates driving power. Power may be supplied to the power converter through the load connector.

One or more aspects of the present invention may also be directed to a power converter for supplying power to a load device connectable to a power supply path in a daisy chain. The power converter includes a connector device attachable to and detachable from the power converter. The connector device includes a housing, an upstream connector connectable to an upstream portion of the power supply path, a downstream connector connectable to a downstream portion of the power supply path, and a load connector that supplies, to the power converter, power divided from an internal supply path connecting the upstream connector and the downstream connector in the housing. In response to the connector device being attached to the power converter, the power supply path supplies power at least partly to the power converter through the load connector. A combination of the power converter and the connector device is changeable to change a combination of the power converter and a rated current of at least one of the upstream connector or the downstream connector based on a current flowing through the upstream connector and a current flowing through the downstream connector. The technical ideas described using the connector device and the load device are also applicable to the power converter when no technical contradiction occurs.

Advantageous Effects

The load device to be connected in a daisy chain for power supply can use appropriate wiring.

DETAILED DESCRIPTION

Example Use

Figure 1:
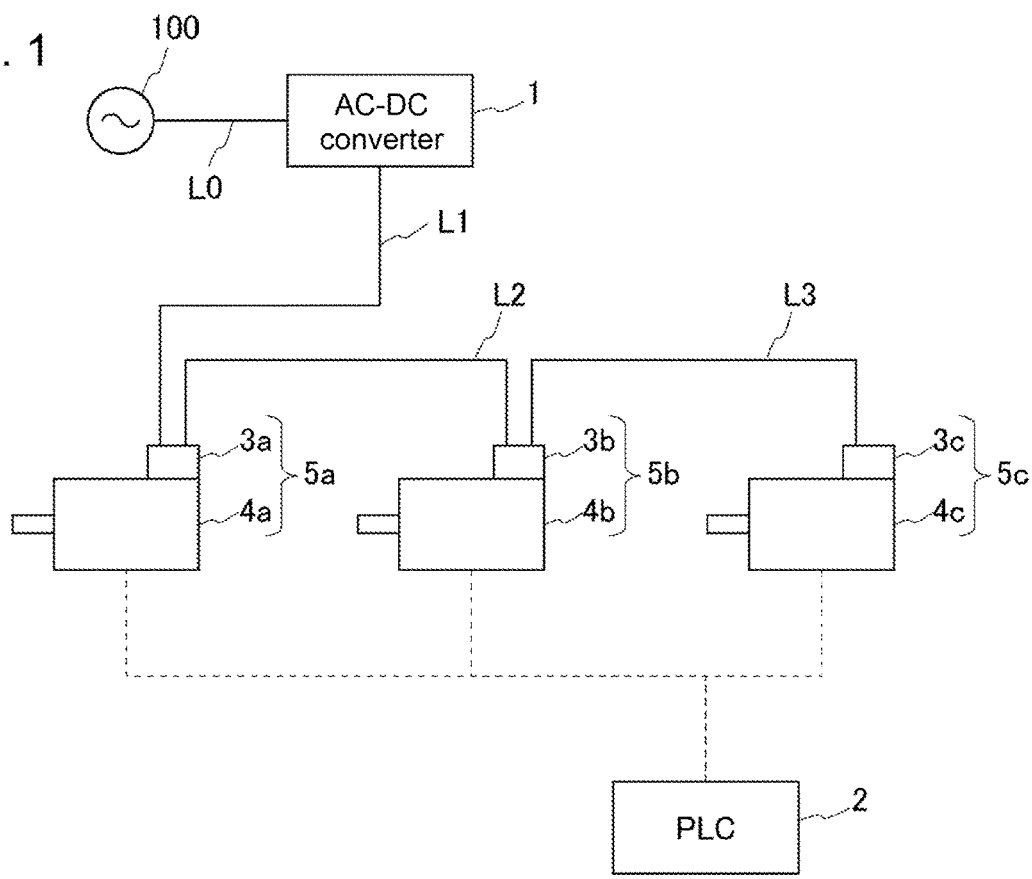
FIG. 1 is a schematic diagram of multiple motors that are connected in a daisy chain to receive power supply.

An example use of a connector device according to one or more embodiments of the present disclosure will be described below with reference to the drawings. FIG. 1 is a schematic diagram of a system for supplying power to motors in equipment or an apparatus including multiple motors 5a to 5c, or load devices, to perform predetermined tasks (e.g., processing or conveying). A motor herein is denoted with reference numeral 5 and referred to as a motor 5, unless the motor is to be identified individually (refer to FIG. 2). The equipment or apparatus may be any of various machines (e.g., industrial robotic arms and conveyors). The motor 5 is, for example, an alternating current (AC) servo motor incorporating a servo driver including an inverter 43 (refer to FIG. 2). An encoder is attached to the motor 5. The servo driver receives, from the encoder, a parameter signal associated with the operation of the motor 5 as a feedback signal.

The servo driver incorporated in each motor 5 receives, from a programmable logic controller (PLC) 2, an operation command signal associated with the operation (motion) of the motor 5. The servo driver performs servo control for driving the motor 5 in response to the operation command signal from the PLC 2 and the feedback signal from the encoder. More specifically, the servo driver calculates a command value for the operation of the motor 5 and controls the inverter 43 to supply a driving current to the motor 5 to cause the motor 5 to operate in accordance with the command value.

The inverter 43 in each motor 5 receives power resulting from an AC-DC converter 1 converting AC power supplied from an external AC power supply 100 through a power system L0 into direct current (DC) power. More specifically, the motor 5a has a power input end connected to an output end of the AC-DC converter 1 with a cable L1 as a power supply path. The motor 5b has a power input end connected to a power output end of the motor 5a with a cable L2 as a power supply path. The motor 5c has a power input end connected to a power output end of the motor 5b with a cable L3 as a power supply path. In other words, the motors 5a to 5c are connected in a daisy chain to the cables L1 to L3 each as a power supply path to receive DC power generated by the AC-DC converter 1.

The structure of the motor 5 will now be described with reference to FIG. 2. The motor 5 includes a motor body 4 and a connector device 3. The motor 5a shown in FIG. 1 includes a motor body 4a and a connector device 3a. The motor 5b includes a motor body 4b and a connector device 3b. The motor 5c includes a motor body 4c and a connector device 3c. The motor bodies 4a to 4c each correspond to the motor body 4. The connector devices 3a to 3c each correspond to the connector device 3.

The connector device 3 connects the motor 5 in a daisy chain to cables each as a power supply path to allow transmission and reception of power between them. More specifically, the connector device 3 includes a box-shaped (e.g., rectangular) housing 36. The housing 36 receives, on its upper surface, a connector 31 fittable to a connector 11a at an end of a cable 11 as a power supply path and a connector 32 fittable to a connector 12a at an end of a cable 12 as a power supply path. The two connectors 31 and 32 are connected to each other with an internal supply path 33 in the housing 36.

Figure 2:
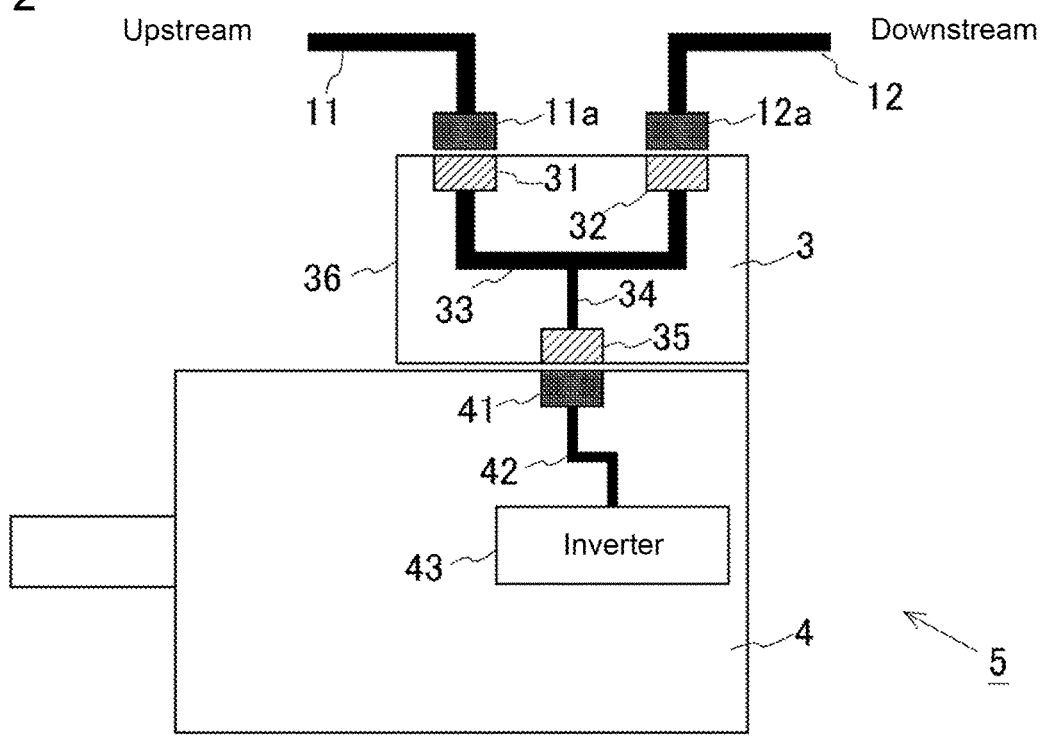
FIG. 2 is a first schematic diagram of an input-output portion for supplying power to a motor connected in a daisy chain.

In the structure shown in FIG. 2, the cable 11 is an upstream cable (nearer the AC-DC converter 1) in the daisy chain. The cable 12 is a downstream cable (farther from the AC-DC converter 1) in the daisy chain. For the motor shown in FIG. 1, for example, the cable L1 corresponds to the cable 11, and the cable L2 corresponds to the cable 12. The connector 31 fittable to the connector 11a in the cable 11 corresponds to an upstream connector in an aspect of the present disclosure, whereas the connector 32 fittable to the connector 12a in the cable 12 corresponds to a downstream connector in an aspect of the present disclosure.

The housing 36 for the connector device 3 receives a connector 35 on its lower surface. The connector 35 is fittable to a connector 41 in the motor body 4 and corresponds to a load connector in an aspect of the present disclosure. The connector 35 is connected to the internal supply path 33 with a branch supply path 34. In the connector device 3, power input into the upstream connector 31 is partly output to the load connector 35 in a divided manner, with the remaining power being output to the downstream connector 32.

The motor body 4 includes components such as a rotor including an output shaft of the motor, a stator, and the encoder. The motor body 4 also incorporates the servo driver including the inverter 43 that generates a driving current for rotating the rotor. The inverter 43 is connected to the connector 41 with a power supply path 42 to receive power for driving the motor 5 through the connector 41.

The housing 36 for the connector device 3 is attachable to and detachable from the motor body 4. The housing 36 may be attached or detached with a known method using, for example, snaps or screws. With the housing 36 attached to the motor body 4, the connector 41 in the motor body 4 and the connector 35 in the connector device 3 remain fitted to each other. Although the single type of connector device 3 is shown in FIG. 2, the connector device 3 may be one of different types of connector devices including the connectors 31 and 32 with different combinations of rated currents. For example, the structure shown in FIG. 3 (described later) includes a connector device 3a including a connector 31 with a relatively high rated current and a connector 32 with a relatively low rated current and connector devices 3b and 3c including connectors 31' and 32' with relatively low rated currents.

In the present embodiment, as described above, a connector device 3 including connectors with rated currents each corresponding to the level of a current flowing in the daisy chain is selectively attached to the motor body 4 to form the motor 5. In other words, the combination of rated currents of the connectors 31 and 32 for the motor 5 may be appropriately changed based on the current flowing through the connectors 31 and 32. Known motors are manufactured without their locations in a daisy chain being predetermined. To respond to large currents, the motors thus include connectors with specifications higher than intended for their rated current. The structure according to the present embodiment allows a connector device to be selectively attached based on a current that actually flows in a daisy chain, and allows the combination of rated currents of connectors to be appropriate for the motor. This structure can avoid using the cables 11 and 12 with unintentionally large diameters connected to the connectors 31 and 32. This reduces the workload for the wiring procedure and also reduces space for equipment or an apparatus including the motors 5.

Figure 3:
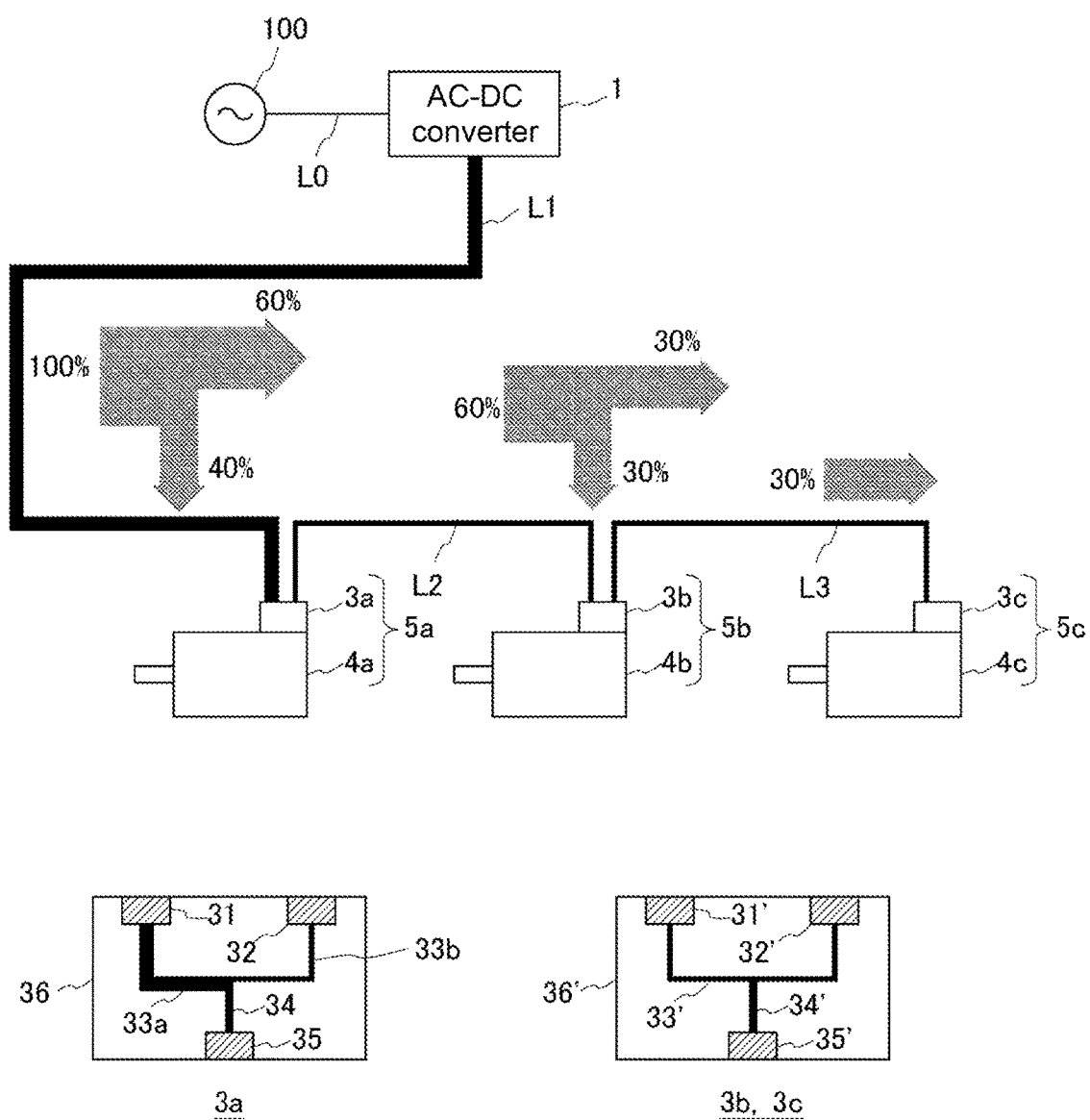
FIG. 3 is a schematic diagram of input-output portions of motors that are connected in a daily chain to receive power supply, also showing the flow of a current through each motor.

A connector device 3 for daisy chain connection will now be described with reference to FIG. 3. Motors 5a to 5c shown in FIG. 3 are connected in a daisy chain in the same manner as in FIG. 1. The motor 5a located most upstream in the daisy chain has a larger capacity than the other two motors 5b and 5c. Of the current from the AC-DC converter 1 being 100% flowing into the motor 5a, 40% of the current is used to drive the motor 5a, and the remaining 60% of the current flows into the motor 5b located subsequently. In the motor 5b receiving the remaining 60% of the current, 30% of the current is used to drive the motor 5*b*, and the remaining 30% of the current flows into the motor 5*c* located subsequently. The remaining 30% of the current received in the motor 5*c* is then used to drive the motor 5*c*.

For such motors connected in a daisy chain, a motor located more upstream receives a larger current and thus is to include a connector device 3 including connectors 31 and 32 having rated currents corresponding to such a larger current. In the present embodiment, the connector device 3*a* in the motor 5*a* includes the connector 31 with a relatively high rated current and the connector 32 with a relatively low rated current. In other words, the connector device 3*a* includes the connectors 31 and 32 with different rated currents. As shown in FIG. 3, in the connector device 3*a*, an internal supply path 33*a* extending from the connector 31 to the branch supply path 34 is designed to have a larger capacity than an internal supply path 33*b* extending from the branch supply path 34 to the connector 32.

In contrast, the connector device 3*b* in the motor 5*b* and the connector device 3*c* in the motor 5*c* each include connectors 31' and 32' with a relatively low rated current (the same rated current as the connector 32). The motor 5*a* includes the connector device 3*a* attached to the motor body 4*a*. The motor 5*b* includes the connector device 3*b* attached to the motor body 4*b*. The motor 5*c* includes the connector device 3*c* attached to the motor body 4*c*.

As described above, the connector devices each including connectors with rated current values corresponding to their actual location connectable to a motor in a daisy chain are attached to the corresponding motor bodies to allow more precise selection of the diameters of the cables in the daisy chain. This structure can more appropriately reduce the workload for the wiring procedure and also reduce space for equipment or an apparatus including the motors.

First Modification

Figure 4A:
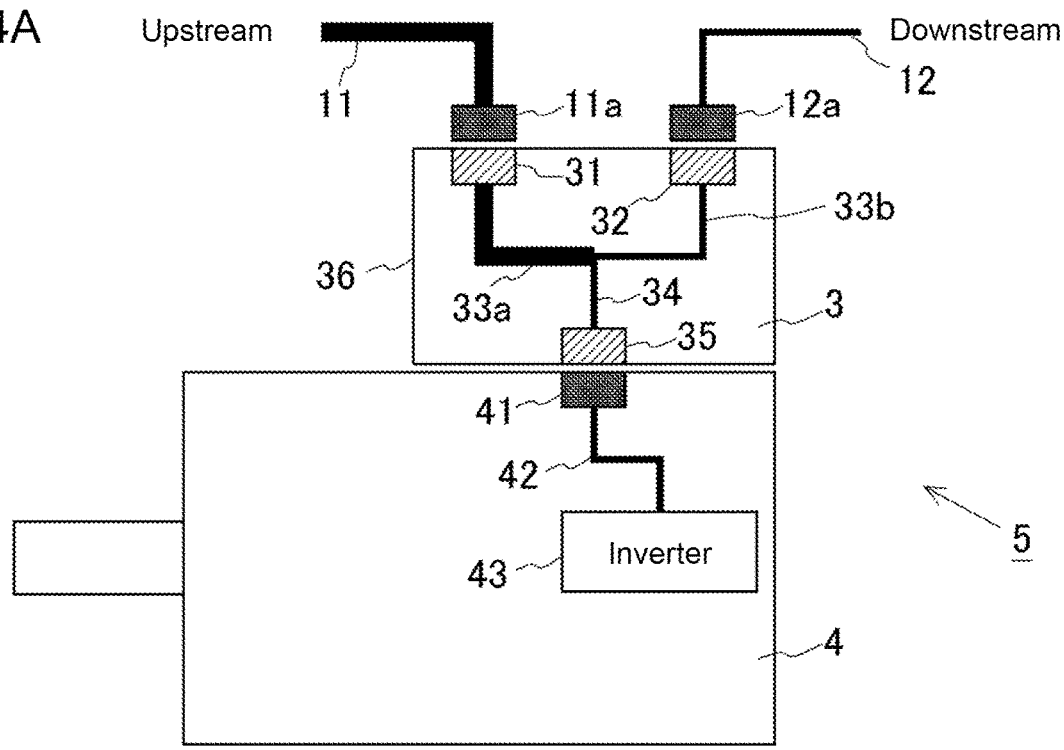
FIGS. 4A and 4B are each a second schematic diagram of an input-output portion for supplying power to a motor connected in a daisy chain.
Figure 4B:
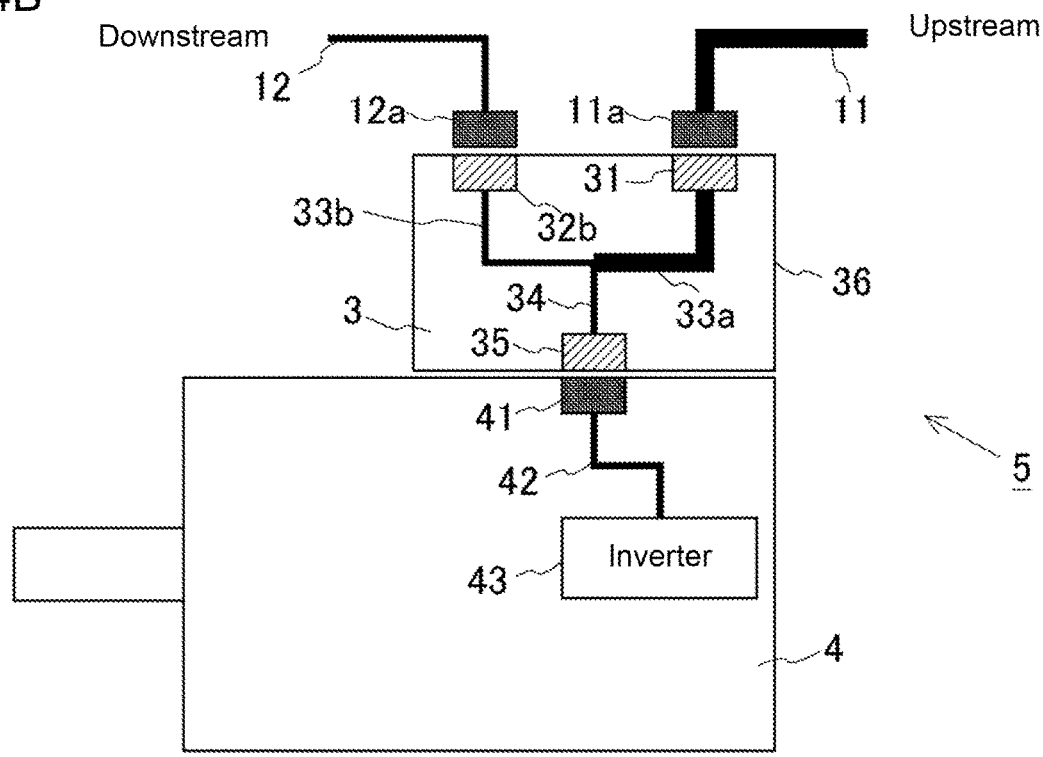

The connector device 3 and the motor 5 with the connector device 3 according to a modification will now be described with reference to FIGS. 4A and 4B. The motor 5 shown in FIG. 4A (upper figure) is the same as the motor in FIG. 3 including the connector device 3*a* attached to the motor body 4*a*. The connector device 3 thus includes the upstream connector 31 with a relatively high rated current and the downstream connector 32 with a relatively low rated current. In the present modification, the connector device 3 with the housing 36 turned by 180 degrees is attachable to the motor body 4 with the connector 35 appropriately fitted to the connector 41 in the motor body 4. FIG. 4B (lower figure) shows the connector device 3 turned by 180 degrees from its location in FIG. 4A (upper figure) and attached to the motor body 4.

This structure allows the connector device 3 of a single type to respond to different daisy chains. In a daisy chain including motors connected sequentially, each motor in the equipment or apparatus may have, depending on its sequential location in the daisy chain, a specific portion (e.g., an output shaft) in a different relationship relative to another motor located upstream (or downstream). For the motor 5 in equipment or an apparatus shown in FIG. 4A (upper figure), for example, any upstream motor in the daisy chain located in a right portion of the figure can cause the cables 11 and 12 to cross each other above the housing 36 for the connector device 3, causing inappropriate wiring. The shells for the connectors on the cables may interfere with each other. The housing 36 may be turned by 180 degrees and attached to the motor body 4 as described above for appropriate wiring in a daisy chain.

Although the housing 36 for the connector device 3 is turned by 180 degrees in the above example, the housing 36 may be turned by an angle other than 180 degrees (e.g., 45 degrees or 90 degrees) and attached to the motor body 4. The connector 35 in the connector device 3 turned and attached to the motor body 4 is to be fitted to the connector 41.

Second Modification

Figure 5:
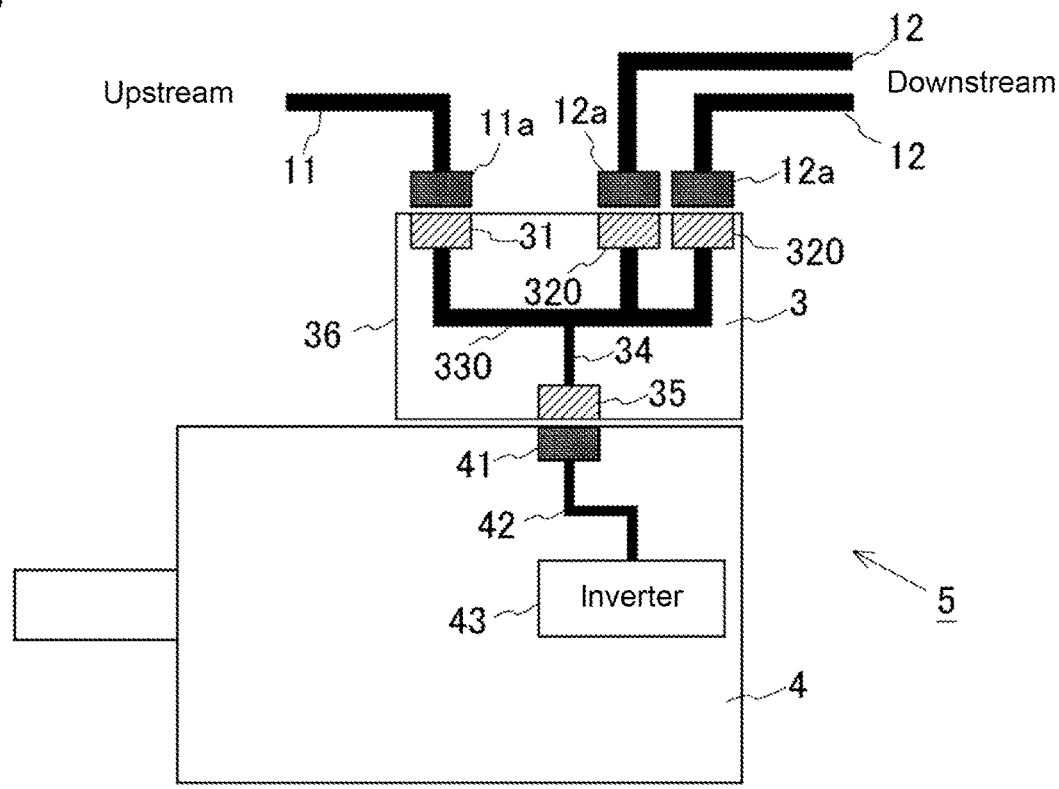
FIG. 5 is a third schematic diagram of an input-output portion for supplying power to a motor connected in a daisy chain.

The connector device 3 and the motor 5 with the connector device 3 according to another modification will now be described with reference to FIG. 5. In the present modification, the connector device 3 includes two connectors 320 as downstream connectors. More specifically, the connector device 3 includes the two connectors 320, in addition to the single connector 31, on the upper surface of the housing 36. The connectors 320 are substantially the same as the connector 32 described above. The single connector 31 is connected to the two connectors 320 in the housing 36 with an internal supply path 330, to which the connector 35 is connected with the branch supply path 34. In the connector device 3 according to the present modification, power input into the upstream connector 31 is partly output to the load connector 35 in a divided manner, with the remaining power being output in a divided manner to each of the two downstream connectors 320.

The connector device 3 with this structure allows connection in a daisy chain to include two downstream branches. As in the examples described above, the structure allows a connector device to be selected based on a current that actually flows in a daisy chain, and allows the combination of rated currents of the connectors to be appropriate for the motor. This structure can avoid using the cable 11 with an unintentionally large diameter connected to the connector 31 and the cables 12 with an unintentionally large diameter connected to the connectors 320.

Third Modification

Figure 6:
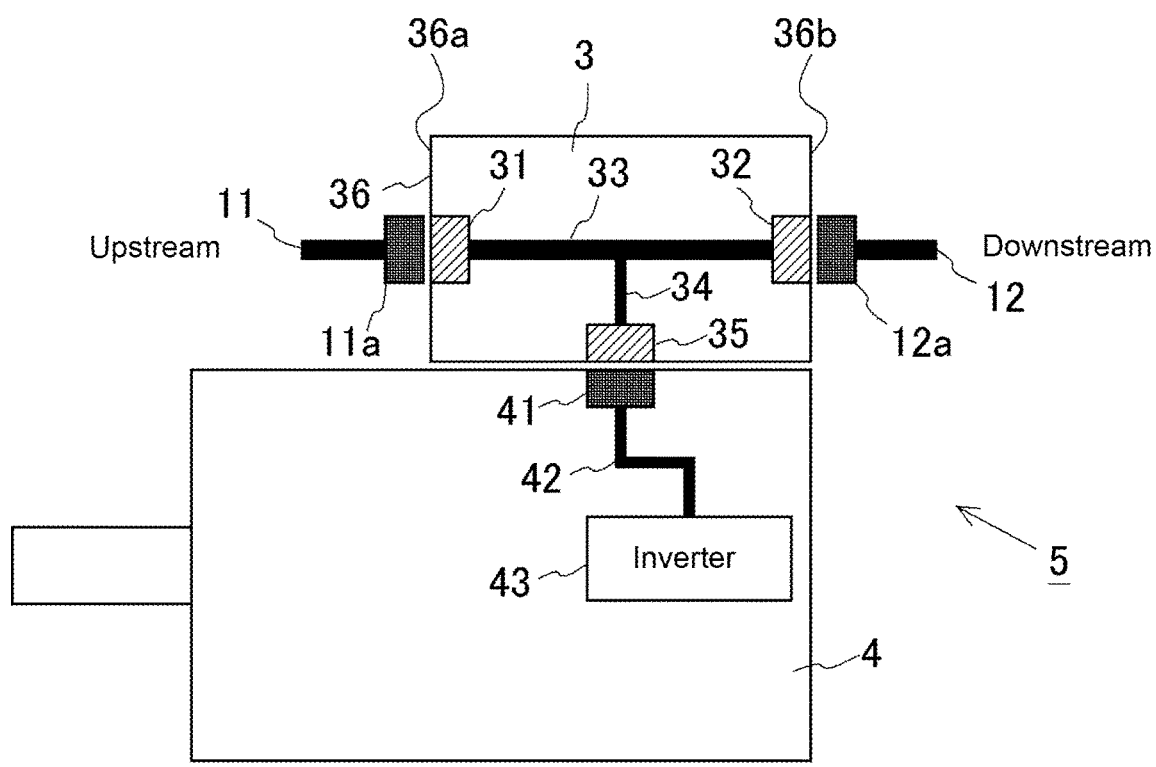
FIG. 6 is a fourth schematic diagram of an input-output portion for supplying power to a motor connected in a daisy chain.

The connector device 3 and the motor 5 with the connector device 3 according to still another modification will now be described with reference to FIG. 6. In the present modification, the upstream connector 31 and the downstream connector 32 are located on different surfaces of the housing 36. More specifically, the connector 31 is located on an upstream surface of the housing 36, whereas the connector 32 is located on a downstream surface of the housing 36. In other words, the connectors 31 and 32 are located on the respective two facing surfaces of the housing 36. The connector device 3 with this structure allows smooth connection in a daisy chain. This structure allows the connector device 3 to be selected based on a current that actually flows in the daisy chain, and allows the combination of rated currents of the connectors to be appropriate for the motor.

Fourth Modification

Figure 7:
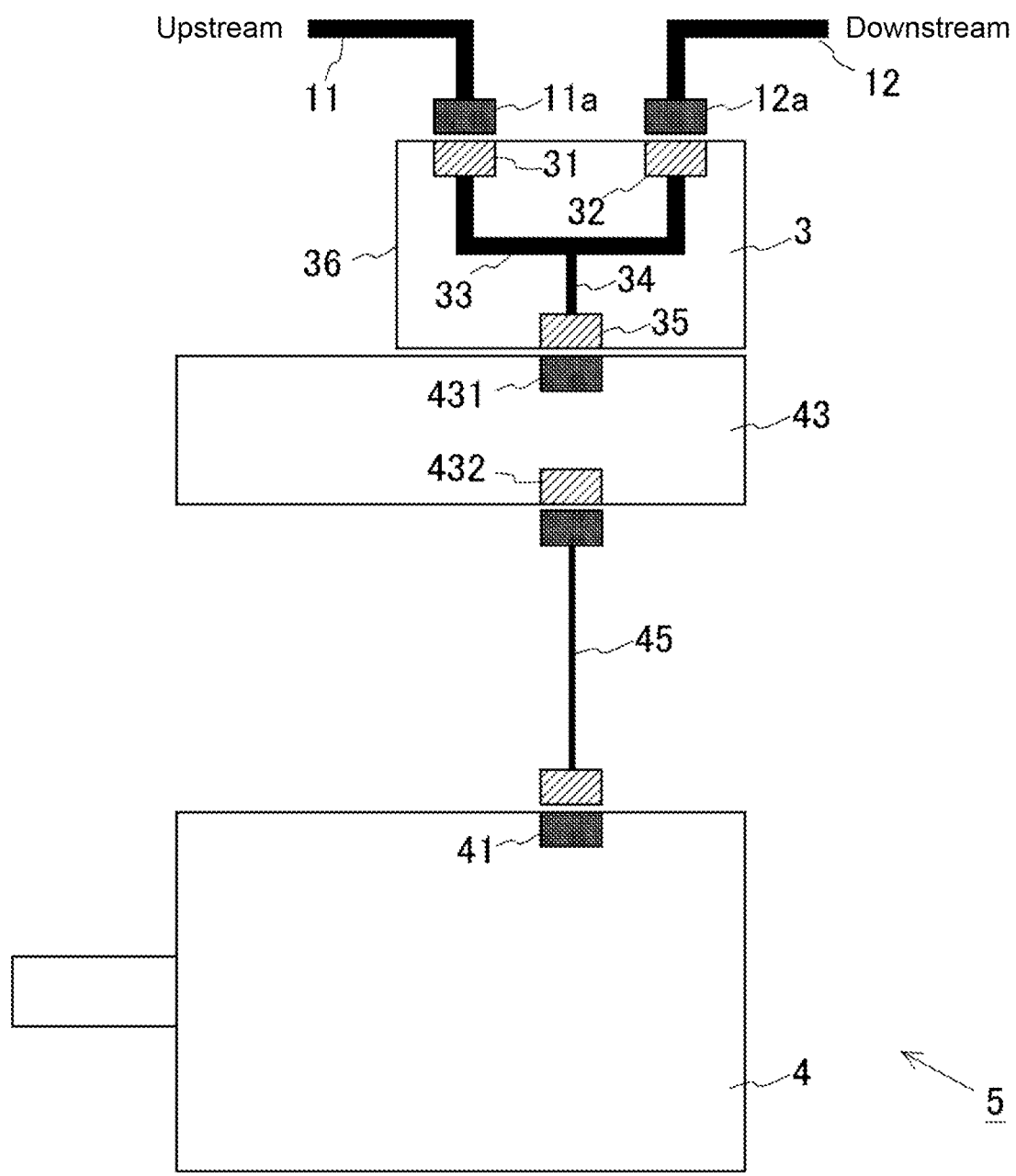
FIG. 7 is a schematic diagram of a power converter that supplies power to a motor connected in a daisy chain.

An example inverter 43 with the connector device 3 will now be described with reference to FIG. 7. In the present modification, the connector device 3 has the same structure as in FIG. 2, except that the inverter 43 is not incorporated in and is separate from the motor body 4. The connector device 3 is attached to the inverter 43. The connector device 3 is attachable to and detachable from the inverter 43. The connector 35 in the connector device 3 is connected to a connector 431 in the inverter 43. An output from the inverter 43 is input into the connector 41 in the motor body 4 through a connector 432 and a power cable 45 connected to the connector 432.

With the connector device 3 attached to the inverter 43, power from the cable 11 is partly supplied to the inverter 43 through the connector 35. For the inverter 43 with this structure, replacing the detachable connector device 3 may change the combination of the inverter 43 and the rated current of at least one of the connectors 31 or 32 based on the current flowing through the connectors 31 and 32. This allows smooth connection of the motor 5 in a daisy chain. This structure allows the connector device to be selected based on a current that actually flows in the daisy chain, and allows the combination of rated currents of the connectors to be appropriate for the motor.

APPENDIX 1

A connector device (3) for connecting a load device (5) to a power supply path (L1, L2, L3) in a daisy chain to allow transmission and reception of power between the load device (5) and the power supply path (L1, L2, L3), the connector device (3) comprising:
 a housing (36);
 an upstream connector (31) connectable to an upstream portion (11) of the power supply path;
 a downstream connector (32) connectable to a downstream portion (12) of the power supply path; and
 a load connector (35) configured to supply, to a body (4) of the load device, power divided from an internal supply path (33) connecting the upstream connector (31) and the downstream connector (32) in the housing (36),
 wherein the connector device (3) is separate from the body (4) of the load device (5), and
 a combination of the load device (5) and a rated current of at least one of the upstream connector (31) or the downstream connector (32) is changeable based on a current flowing through the upstream connector (31) and a current flowing through the downstream connector (32).

APPENDIX 2

A power converter (43) for supplying power to a load device connectable to a power supply path (L1, L2, L3) in a daisy chain, the power converter (43) comprising:
 a connector device (3) attachable to and detachable from the power converter (43),
 wherein the connector device (3) includes
  a housing (36),
  an upstream connector (31) connectable to an upstream portion (11) of the power supply path,
  a downstream connector (32) connectable to a downstream portion (12) of the power supply path, and
  a load connector (35) configured to supply, to the power converter (43), power divided from an internal supply path (33) connecting the upstream connector (31) and the downstream connector (32) in the housing (36),
 in response to the connector device (3) being attached to the power converter (43), the power supply path (L1, L2, L3) supplies power at least partly to the power converter (43) through the load connector (35), and
 a combination of the power converter (43) and the connector device (3) is changeable to change a combination of the power converter (43) and a rated current of at least one of the upstream connector (31) or the downstream connector (32) based on a current flowing through the upstream connector (31) and a current flowing through the downstream connector (32).

| | |
|---|---|
| 3, 3a, 3b, 3c | connector device |
| 4, 4a, 4b, 4c | motor body |
| 5, 5a, 5b, 5c | motor |
| 31 | connector (upstream connector) |
| 32 | connector (downstream connector) |
| 33 | internal supply path |
| 34 | branch supply path |
| 35 | connector (load connector) |

The invention claimed is:

1. A connector device for connecting a load device to a power supply path in a daisy chain to allow transmission and reception of power between the load device and the power supply path, the connector device comprising:
 a housing;
 an upstream connector connectable to an upstream portion of the power supply path;
 a downstream connector connectable to a downstream portion of the power supply path; and
 a load connector configured to supply, to a body of the load device, power divided from an internal supply path connecting the upstream connector and the downstream connector in the housing,
 wherein the connector device is separate from the body of the load device, and
 a combination of the load device and a rated current of at least one of the upstream connector or the downstream connector is selected based on an expected current through the upstream connector and an expected current through the downstream connector.

2. The connector device according to claim 1, wherein the upstream connector has a higher rated current than the downstream connector.

3. The connector device according to claim 1, wherein the upstream connector and the downstream connector have a same rated current.

4. The connector device according to claim 1, wherein the connector device is attachable to and detachable from the body of the load device, and
 in response to the connector device being attached to the body of the load device, the power supply path supplies power at least partly to the load device through the load connector.

5. The connector device according to claim 1, wherein the housing is box-shaped and has a plurality of surfaces, and
 the upstream connector and the downstream connector are located on different surfaces of the plurality of surfaces.

6. The connector device according to claim 5, wherein the upstream connector and the downstream connector are located on two facing surfaces of the plurality of surfaces.

7. The connector device according to claim 1, wherein the connector device includes a plurality of the downstream connectors connected to the upstream connector with the internal supply path.

8. A power converter for supplying power to a load device connectable to a power supply path in a daisy chain, the power converter comprising:
 a connector device attachable to and detachable from the power converter,
 wherein the connector device includes
 a housing,
 an upstream connector connectable to an upstream portion of the power supply path, a downstream connector connectable to a downstream portion of the power supply path, and a load connector configured to supply, to the power converter, power divided from an internal supply path connecting the upstream connector and the downstream connector in the housing, in response to the connector device being attached to the power converter, the power supply path supplies power at least partly to the power converter through the load connector, and a combination of the power converter and the connector device is selected to select a combination of the power converter and a rated current of at least one of the upstream connector or the downstream connector based on an expected current through the upstream connector and an expected current through the downstream connector.

9. The power converter according to claim 8, wherein the connector device is attachable to and detachable from the load device in an orientation to change positions of the upstream connector and the downstream connector relative to a body of the load device.

10. The power converter according to claim 9, wherein the connector device is attachable to the body of the load device with the upstream connector located adjacent to a load device upstream in a daisy chain and with the downstream connector located adjacent to a load device downstream in the daisy chain.

11. The power converter according to claim 8, wherein the upstream connector has a higher rated current than the downstream connector.

12. The power converter according to claim 8, wherein the upstream connector and the downstream connector have a same rated current.

13. The power converter according to claim 8, wherein the housing is box-shaped and has a plurality of surfaces, and the upstream connector and the downstream connector are located on different surfaces of the plurality of surfaces.

14. The power converter according to claim 13, wherein the upstream connector and the downstream connector are located on two facing surfaces of the plurality of surfaces.

15. The power converter according to claim 8, wherein the connector device includes a plurality of the downstream connectors connected to the upstream connector with the internal supply path.

16. A load device to receive driving power supplied from the power converter according to claim 8, the load device being connectable in a daisy chain to the power supply path with the power converter, the load device comprising:

a body; and the power converter incorporated in the body.

* * * * *